United States Patent
Seo

(10) Patent No.: US 8,633,503 B2
(45) Date of Patent: Jan. 21, 2014

(54) WAFER LEVEL LIGHT EMITTING DIODE PACKAGE AND METHOD OF FABRICATING THE SAME

(75) Inventor: Won Cheol Seo, Hwaseong-si (KR)

(73) Assignee: Seoul Opto Device Co., Ltd., Ansan-si (KR)

(*) Notice: Subject to any disclaimer, the term of this patent is extended or adjusted under 35 U.S.C. 154(b) by 117 days.

(21) Appl. No.: 13/243,764

(22) Filed: Sep. 23, 2011

(65) Prior Publication Data

US 2012/0248481 A1    Oct. 4, 2012

(30) Foreign Application Priority Data

Sep. 30, 2010  (KR) .................. 10-2010-0095528

(51) Int. Cl.
*H01L 33/00* (2010.01)
(52) U.S. Cl.
USPC ............................................. 257/98; 257/778
(58) Field of Classification Search
USPC ................................................ 257/98, 99, 778
See application file for complete search history.

(56) References Cited

U.S. PATENT DOCUMENTS

| 2005/0139846 A1* | 6/2005 | Park et al. ...................... 257/98 |
| 2006/0261364 A1 | 11/2006 | Suehiro et al. |

FOREIGN PATENT DOCUMENTS

| KR | 10-2005-0066030 | 6/2005 |
| KR | 10-2006-0095271 | 8/2006 |
| KR | 10-2009-0072941 | 7/2009 |

\* cited by examiner

*Primary Examiner* — Mark Prenty
(74) *Attorney, Agent, or Firm* — H.C. Park & Associates, PLC

(57) ABSTRACT

An exemplary embodiment of the present invention discloses a wafer level light emitting diode package that includes a first substrate having an insulating-reflecting layer and an electrode pattern arranged on a surface of the first substrate, and a conductive via, a terminal on which the first substrate is arranged, a second substrate arranged on the first substrate, the second substrate including a cavity-forming opening, the cavity-forming opening exposing the electrode pattern, and a light-emitting chip arranged on the electrode pattern. The light-emitting chip is a flip-bonded light-emitting structure without a chip substrate, and the conductive via electrically connects the electrode pattern and the terminal.

11 Claims, 5 Drawing Sheets

WAFER LEVEL LIGHT EMITTING DIODE PACKAGE AND METHOD OF FABRICATING THE SAME

CROSS REFERENCE TO RELATED APPLICATION

This application claims priority from and the benefit of Korean Patent Application No. 10-2010-0095528, filed on Sep. 30, 2010, which is hereby incorporated by reference for all purposes as if fully set forth herein.

BACKGROUND OF THE INVENTION

1. Field of the Invention

Exemplary embodiments of the present invention relate to a light emitting diode package and a method of fabricating the same, and more particularly, to a wafer level light emitting diode package and a method of fabricating the same.

2. Discussion of the Background

In general, a light emitting diode (LED) refers to a light-emitting semiconductor device, and the color of generated light may vary depending on changes in the compound semiconductor materials, such as GaAs, AlGaAs, GaN, and InGaInP.

By applying a current to the LED, electron-hole recombination occurs at the junction between a p-type semiconductor and an n-type semiconductor, which leads to the generation of light in the LED.

Measured characteristics of an LED device may include color, luminance, luminance intensity, thermal and electrical reliability, and the like. Although the device characteristics may be determined by compound semiconductor materials, which are used in the LED device, the structure of a package in which a light-emitting chip is mounted may influence the device characteristics.

A package structure may not realize sufficient heat dissipation characteristics (referring to heat dissipation to the outside of the package structure) when the device generates light, relying only on the development of package components.

Since the LED package may be required to exhibit not only thermal and electrical reliability but also optical characteristics, it may have a structure different from that of a typical semiconductor package.

A lead frame type mold package is an example of an LED package. The lead frame type mold package includes a package body, which is an injection molded resin material that forms a cavity in which a light-emitting chip is disposed, and a pair of lead frames, which are integrally shaped inside the package body to be spaced apart from each other at a predetermined interval. Here, the light-emitting chip is wire-bonded to the lead frames via metal wires.

A ceramic type mold package is another example of an LED package, in which a ceramic substrate is formed by stacking multiple layers of ceramic sheets over one another, in which a light-emitting chip mounted on the upper surface of the ceramic substrate is electrically connected to an electrode pattern formed on the upper surface of the ceramic substrate via metal wires, and in which a transparent resin material encapsulates the upper surface of the ceramic substrate, thereby forming an encapsulant.

However, these mold packages of the related art are limited in the extent to which they can simplify manufacturing processes, enable miniaturization by being reduced in size, and help realize batch processing. Therefore, wafer level packaging technology has been introduced in order to realize the simplification, miniaturization, and batch processing of LEDs.

Korean Patent Application Publication No. 10-2006-0095271, applied for by Park, et al., discloses a method of fabricating an LED package at the wafer level. The wafer level LED package is fabricated by mounting a plurality of light-emitting chips on a wafer substrate, applying a fluorescent paste over the upper surface of the mounted light-emitting chip, curing the fluorescent paste, and cutting the resultant structure at a chip size.

In this method of fabricating an LED package, however, the wafer substrate and the fluorescent paste form heterogeneous bonding and have different thermal expansion coefficients. Therefore, external moisture may penetrate into the package through the interface between the wafer substrate and the fluorescent paste, and thermal deformation may occur, thereby acting as factors that may increase a defect ratio.

In addition, the wafer level LED package of the related art has a limited ability to increase light extraction efficiency by increasing the efficiency of reflection of light to the outside when the light-emitting chip operates, or by increasing the transmissivity of light through a chip substrate of the light-emitting chip.

SUMMARY OF THE INVENTION

Exemplary embodiments of the present invention provide a wafer level LED package and a method of fabricating the same.

Exemplary embodiments of the present invention also provide an LED that may prevent moisture from penetrating through a bonding surface and prevent thermal deformation from occurring, thereby improving product reliability, increase reflecting efficiency when a light-emitting chip generates light, and increase light extraction efficiency, thereby improving the optical properties of the package.

Additional features of the invention will be set forth in the description which follows, and in part will be apparent from the description, or may be learned by practice of the invention.

An exemplary embodiment of the present invention discloses a wafer level light emitting diode package that includes a first substrate including an insulating-reflecting layer and an electrode pattern arranged on a surface of the first substrate, and a conductive via, a terminal on which the first substrate is arranged, a second substrate arranged on the first substrate, the second substrate including a cavity-forming opening, the cavity-forming opening exposing the electrode pattern, and a light-emitting chip arranged on the electrode pattern. The light-emitting chip is a flip-bonded light-emitting structure without a chip substrate, and the conductive via electrically connects the electrode pattern and the terminal.

An exemplary embodiment of the present invention also discloses a method of fabricating a wafer level light emitting diode package, the method including forming at least one insulating-reflecting layer on a surface of a first substrate; forming an electrode pattern on the at least one insulating-reflecting layer, forming a conductive via in the first substrate, forming an electrode on a second surface of the first substrate, the second surface being opposite to the first surface, and the conductive via connecting the electrode to the electrode pattern, bonding a second substrate onto the first substrate, the second substrate having a cavity-forming opening, the cavity-forming opening exposing the electrode pattern, mounting a light-emitting chip on the electrode pattern, the light-emitting chip having a chip substrate and a light emitting structure, removing the chip substrate, thinning the second substrate so that the second substrate has an upper surface substantially coplanar to an upper surface of the light-emitting chip from which the chip substrate was removed, the second substrate upper surface and the light-emitting chip upper surface being coplanar along a top horizontal surface of the wafer level light emitting diode package, and producing an individual wafer level light emitting diode package by cutting the first substrate and the second substrate.

An exemplary embodiment of the present invention also discloses a light emitting diode package that includes a first substrate, a reflective insulating layer disposed on a first side of the first substrate, an electrode disposed on the reflective insulating layer, a terminal disposed on a second side of the first substrate, the first side and the second side of the first substrate being opposite sides of the first substrate, a conductive via electrically connecting the electrode and the terminal, a second substrate arranged on the first side of the first substrate, the second substrate having an opening exposing the electrode, and a light-emitting chip arranged on the electrode, the light-emitting chip being a flip-chip bonded light-emitting structure without a chip substrate.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Figure 1:
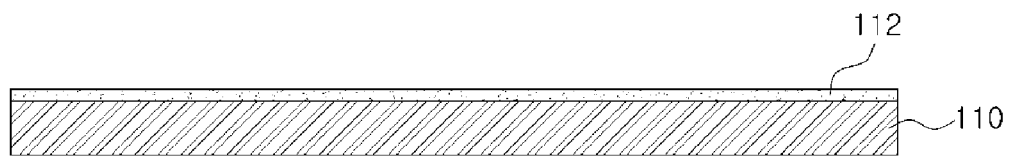
FIG. 1, FIG. 2, FIG. 3, FIG. 4, FIG. 5, FIG. 6, FIG. 7, and FIG. 8 are cross-sectional views showing a method of fabricating a wafer level LED package according to a first exemplary embodiment of the present invention.

The invention is described more fully hereinafter with reference to the accompanying drawings, in which embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

A method of fabricating a wafer level LED package 100 according to a first exemplary embodiment of the present invention includes the steps of preparing a lower substrate, forming conductive vias, bonding an upper substrate, mounting a light-emitting chip, removing a chip substrate, reducing the thickness of the upper substrate, and cutting the resultant structure, as shown in FIG. 1, FIG. 2, FIG. 3, FIG. 4, FIG. 5, FIG. 6, FIG. 7, and FIG. 8.

As shown in FIG. 1, the step of preparing a lower substrate includes providing a lower substrate 110. The lower substrate 110 has at least one insulating-reflecting layer 112 formed over the upper surface thereof. Light-emitting chips 130 may be mounted on the insulating-reflecting layer 112.

The lower substrate 110 can be made of a substrate material selected from among SiC, Si, GaN, and AlN. The insulating-reflecting layer 112 may be formed as a distributed Bragg reflector (DBR), which refracts and reflects light that is generated from the light-emitting chips 130 in a particular wavelength range. The insulating-reflecting layer 112 may be made of titanium (Ti) oxide, silicon (Si) oxide, niobium (Nb) oxide, and Si nitride in order to form an insulating layer on the upper surface thereof, which may be bonded to an upper substrate 120 (see FIG. 4), while increasing light extraction efficiency.

Figure 2:
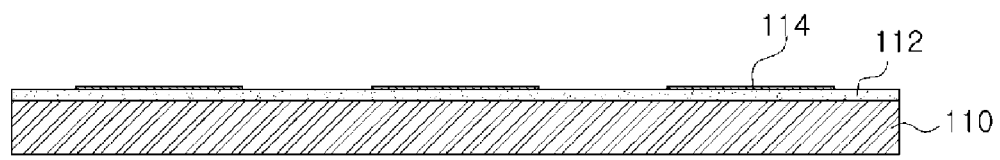
Figure 3:
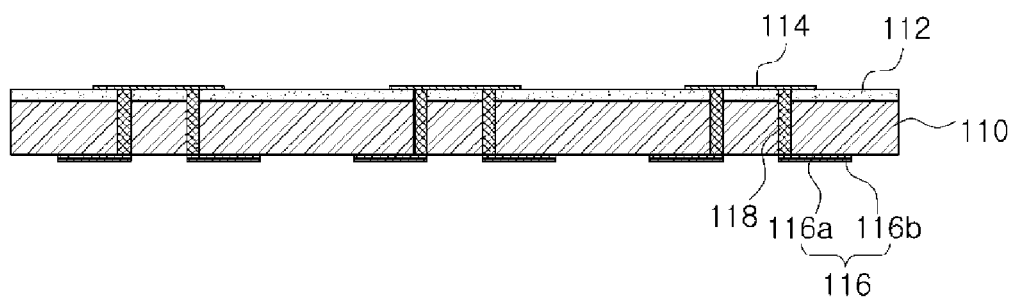

In the step of forming conductive vias, as shown in FIG. 2 and FIG. 3, conductive vias 118 are formed such that they electrically connect an electrode pattern 114, which is formed on the insulating-reflecting layer 112 overlying the upper surface of the lower substrate 110, to external terminals 116, which are formed on the underside of the lower substrate 110.

That is, through-holes are formed to penetrate the areas of the lower substrate 110 on which the light-emitting chips 130 may be mounted, and are filled with the conductive vias 118. Afterwards, the electrode pattern 114 is formed such that it is in contact with the upper end of the conductive vias 118. The electrode pattern 114 is formed such that it is electrically connected to the light-emitting chips 130 when the light-emitting chips 130 are mounted on the patterned upper areas of the lower substrate 110. Subsequently, the external terminals 116 are formed such that they are in contact with the lower end of the conductive vias 118.

Here, each of the external terminals 116 includes an electrode pad 116a, which is pattern-printed on the underside of the lower substrate 110 such that it is in contact with the lower end of the conductive vias 118, and a eutectic electrode 116b, which is deposited on the electrode pad 116a.

The eutectic electrode 116b may be made of gold (Au)/tin (Sn), indium (In), aluminum (Al), silver (Ag), or an alloy including combinations of these, in order to produce a stable bonding force when the wafer level LED package 100 is mounted on a metal substrate or a silicon substrate.

The external terminal 116 is a power input terminal which may be connected to an external circuit (not shown), such as a Printed Circuit Board (PCB), from which electrical power is input to the external terminal 116.

Figure 4:
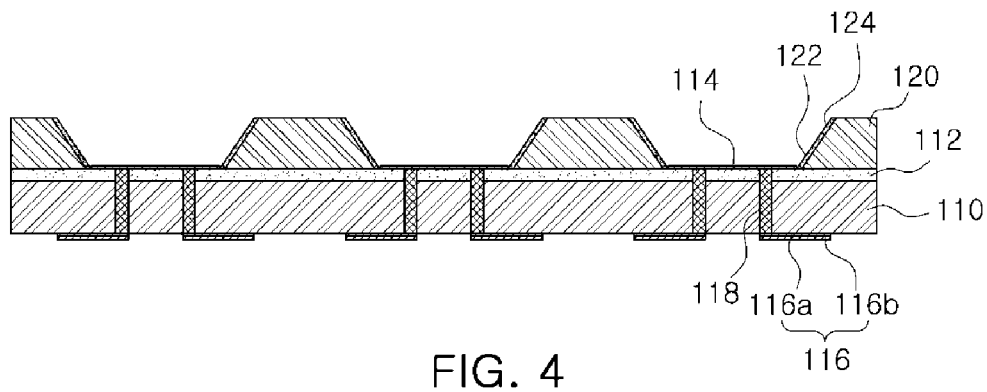

As shown in FIG. 4, the step of bonding an upper substrate is performed to bond the upper substrate 120 onto the upper surface of the lower substrate 110. The upper substrate 120 has openings 124, each of which forms a cavity (Hereinafter, referred to as "cavity-forming opening"). The cavity-forming opening 124 has a predetermined size and is perforated through the upper substrate 120.

The upper substrate 120 is a substrate member, in which the cavity-forming opening 124 having a predetermined size is perforated in the area corresponding to the electrode pattern 114, which is pattern-printed on the upper surface of the lower substrate 110. The cavity-forming opening 124 may be formed by wet etching.

The cavity-forming opening 124, in which the light-emitting chip 130 may be mounted, is formed at a predetermined size by forming a pattern, which is supposed to form the cavity-forming opening 124 by photolithography, on the upper surface of the upper substrate 120, and then etching the upper substrate 120 using a wet etching solution, such as potassium hydroxide (KOH), tetramethylammonium hydroxide (TMAH), or ethylenediamine pyrocatechol (EDP), so that the etching solution perforates the upper substrate 120.

The upper substrate 120 can be made of a substrate material that is the same as or different from that of the lower substrate 110.

Here, the cavity-forming opening 124 is in the form of a slope that is inclined at a predetermined angle, and a reflecting layer 122 is formed over the slope of the cavity-forming opening 124 such that it can reflect light, which is generated when the light-emitting chip 130 operates. The reflecting layer 122 may be made of a reflective material that is the same as or different from that of the insulating-reflecting layer 112, which is formed over the upper surface of the lower substrate 110.

Figure 5:
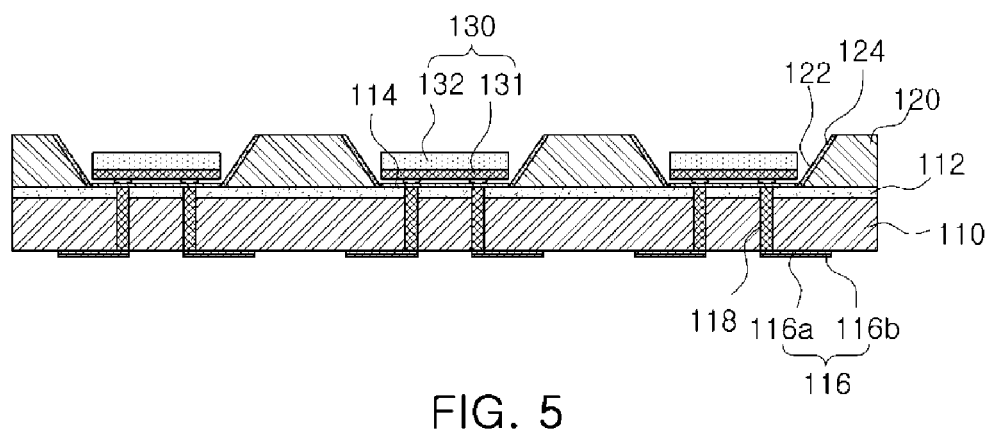

As shown in FIG. 5, in the step of mounting a light-emitting chip, the light-emitting chips 130, each of which includes a light-emitting structure 131 and a chip substrate 132, are mounted on the electrode pattern 114 of the lower substrate 110, which is exposed through the cavity-forming openings 124 of the upper substrate 120.

The light-emitting chip 130 includes the chip substrate 132 and the light-emitting structure 131. The light-emitting structure 131 is made of an n-semiconductor layer, an active layer, and a p-semiconductor layer, which are sequentially layered over the upper surface of the chip substrate 132.

The chip substrate 132 is a growth substrate, which is provided to grow a nitride semiconductor layer thereon. The chip substrate 132 is a high-resistance substrate, which maybe a sapphire substrate.

The sapphire substrate may be used as a substrate for growing nitride semiconductor thereon, since it is made of a crystal that has hexa-rhombo R3c symmetry, with lattice constants of 13.001 Å and 4.758 Å in c- and a-axis orientations. It also has C (0001) plane, A (1120) plane, and R (1102) plane, in which it is relatively easier to grow a nitride thin film over the C plane. The sapphire substrate is stable at high temperature.

The n-semiconductor layer and the p-semiconductor layer can be made of semiconductor materials that are expressed by a compositional formula $Al_xIn_yGa_{(1-x-y)}N$, where $0 \leq x \leq 1$, $0 \leq y \leq 1$, $0 \leq x+y \leq 1$, doped with n-dopant and p-dopant, respectively. Representative examples of the semiconductor materials may include GaN, AlGaN, and InGaN.

In addition, available examples of the n-dopant may include Si, germanium (Ge), selenium (Se), tellurium (Te), carbon (C), and the like, and available examples of the p-dopant may include magnesium (Mg), zinc (Zn), beryllium (Be), and the like.

The n- and p-semiconductor layers can be formed using a known method of growing a nitride semiconductor layer, examples of which may include Metal Organic Chemical Vapor Deposition (MOCVD), Molecular Beam Epitaxy (MBE), and Hydride Vapor Phase Epitaxy (HVPE), and the like.

In addition, although not shown, a buffer layer can be formed over the substrate 110 in order to reduce lattice mismatching between the chip substrate and the n-semiconductor layer. The buffer layer can be a low-temperature nucleus growth layer containing AlN or n-GaN, as an n-material layer or an undoped material layer, which is made of a III-V group nitride compound semiconductor.

In addition, the active layer is a material layer in which light emission occurs through electron-hole carrier recombination. The active layer may be a compound semiconductor layer containing III-V ground nitride, such as GaN, and have a multi quantum well (MQW) structure, in which multiple quantum well layers and quantum barrier layers are laminated alternately over each other. In the MQW structure, the quantum barrier layers can be made of a material that is expressed by $Al_xIn_yGa_{(1-x-y)}N$, where $0 \leq x \leq 1$, $0 \leq y \leq 1$, $0 < x+y \leq 1$, and the quantum well layers can be made of a material that is expressed by $In_zGa_{(1-z)}N$, where $0 \leq z \leq 1$. The quantum barrier layers can be provided in the form of a superlattice structure having a predetermined thickness such that holes, which are injected from the p-semiconductor layer, can pass through them by tunneling.

Light generated from the light-emitting chip 130, is emitted to the outside through the chip substrate 132. Since the chip substrate 132 has a low light transmittance, it is preferred that the chip substrate 132 be removed in order to increase light extraction efficiency when the light-emitting structure 131 generates light.

Figure 6:
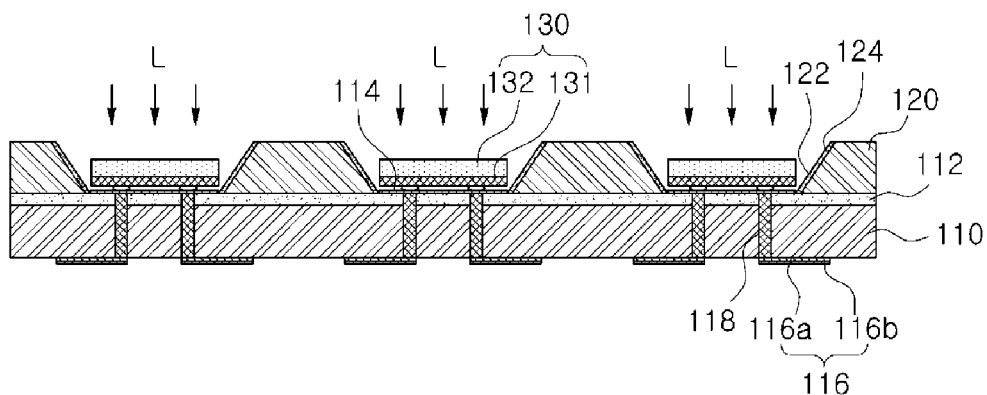

In the step of removing the chip substrate 132, as shown in FIG. 6, the chip substrate 132 is removed by radiating laser beams L onto the chip substrate 132 of the light-emitting chip 130 so that the light-emitting structure 131 is exposed to the outside.

That is, when an excimer laser beam having a wavelength ranging from 198 nm to 248 nm is radiated onto the surface of the chip substrate 132, the temperature of the interface between the nitride semiconductor layer of the light-emitting structure 131, which is the epitaxially grown layer, and the chip substrate 132, which is the sapphire substrate, rises sharply since it absorbs most of the laser beam.

As the temperature of the interface between the nitride semiconductor layer and the chip substrate 132 rises sharply, the chemical bonding at the interface is broken so that the nitride semiconductor film is separated from the chip substrate 132, namely, the sapphire substrate.

Here, the wavelength of the excimer laser beams depend on the type of the buffer layer, which may be grown over the sapphire ship substrate, and the energy of the excimer laser beams may be greater than the band gap of the buffer layer (interface). In particular, the excimer laser having a short wavelength may minimize damage to the nitride semiconductor layer, since the thickness of the light-absorbing layer in the nitride semiconductor layer may be reduced.

After the step of removing the chip substrate 132, a wavelength-converting structure 140 may be formed in order to convert light having a specific wavelength, which is emitted from the light-emitting structure 131, into white light.

Figure 7:
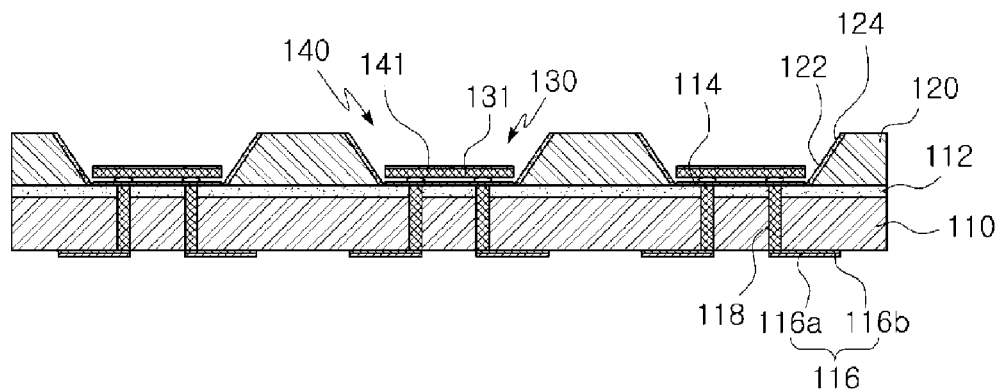
Figure 9:
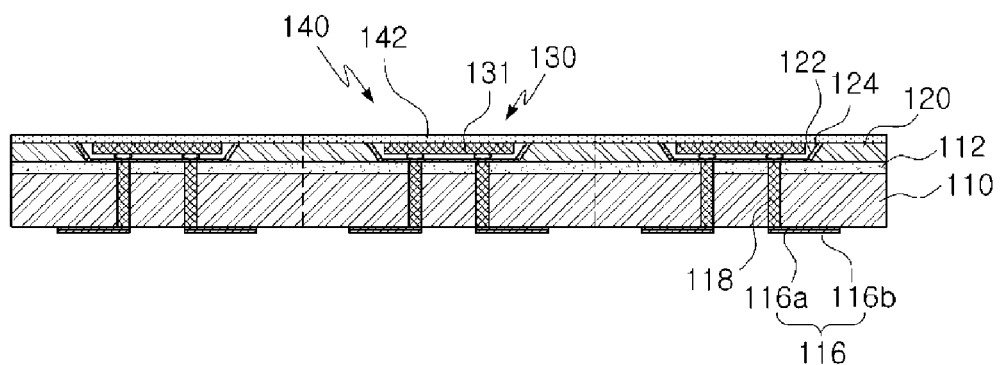
FIG. 9 is a cross-sectional view showing a step of forming a fluorescent film in a method of fabricating a wafer level LED package according to a second exemplary embodiment of the present invention.
Figure 10:
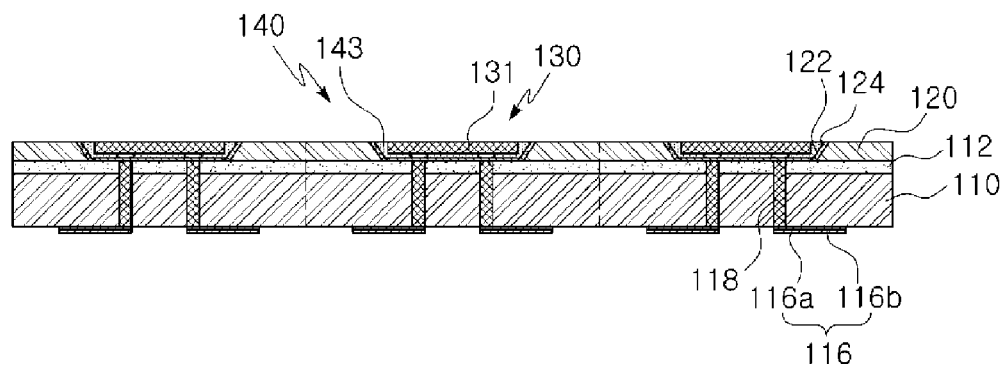
FIG. 10 is a cross-sectional view showing a step of forming a fluorescent resin material in a method of fabricating a wafer level LED package according to a third exemplary embodiment of the present invention.

The wavelength-converting structure 140 may be formed as a fluorescent layer 141 shown in FIG. 7, a fluorescent film 142 shown in FIG. 9, or a resin fluorescent material 143 shown in FIG. 10. As shown in FIG. 7, the fluorescent layer 141 contains a fluorescent material, is and is formed, by coating, over the upper surface of the light-emitting structures 131, which are exposed to the outside, with the light-emitting structures 131 removed therefrom. As shown in FIG. 9, the fluorescent film 142 contains a fluorescent material, and is applied over the upper surface of the upper substrate 120 and the light-emitting structure 131. As shown in FIG. 10, the resin fluorescent material 143 contains a fluorescent material, and is dispensed into the cavity-forming openings 124, which are formed in the upper substrate, and in which the light-emitting chips 130 are disposed.

Although the fluorescent film 142 has been described as being bonded to the upper surface of the light-emitting structures 131 as well as to the upper surface of the upper substrate 120, other arrangements are possible. For example, the fluorescent film 142 can be bonded only to the upper surface of the light-emitting structures 131 like the fluorescent layer 141.

The fluorescent material, which is contained in the fluorescent layer 141, the fluorescent film 142, and the resin fluorescent material 143, forms a wavelength-converter that converts light having a red, blue, or green wavelength, which is generated from the light-emitting structure 131, into white light.

The fluorescent material can be powder that contains yttrium aluminum garnet (YAG), terbium aluminum garnet (TAG), silicate, or the like in order to convert first wavelength light, such as red, blue, or green light, which is generated from the light-emitting structure 131, into second wavelength light, i.e. white light.

Figure 8:
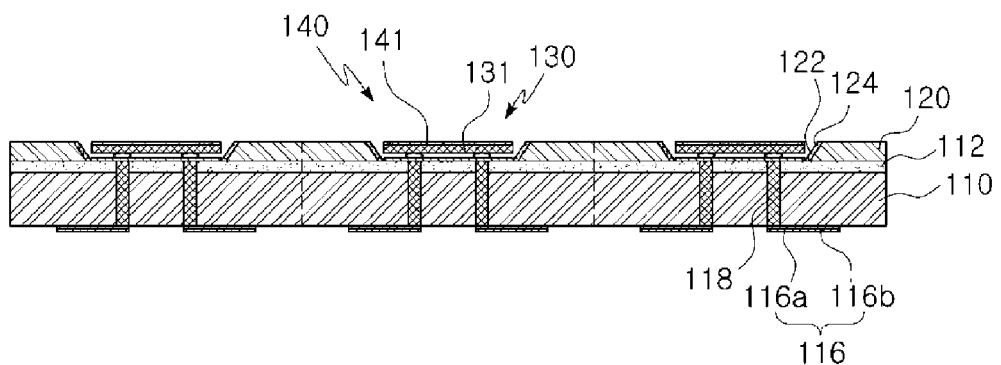

Subsequently, as shown in FIG. 8, the step of reducing the thickness of the upper substrate 120 is carried out to reduce the overall thickness of the wafer level LED package 100 that includes the upper substrate 120 and the lower substrate 110. Specifically, the upper surface of the upper substrate 120 is removed by polishing it using an abrasive so that the upper surface of the light-emitting structures 131, which are exposed by removing the chip substrates 132 from the light-emitting chips 130, is substantially at the same level as the upper surface of the upper substrate 120. In other words, the upper surface of the light-emitting structures 131 and the upper surface of the upper substrate 120 are substantially coplanar.

Finally, after the thickness of the upper substrate 120 is reduced by removing the upper surface thereof, the resultant structure that includes the upper substrate 120 and lower substrate 110 is cut along cutting lines using a cutting tool, thereby producing individual wafer level LED packages 100, which are separated from each other, as shown by the dotted lines in FIG. 8.

Figure 11:
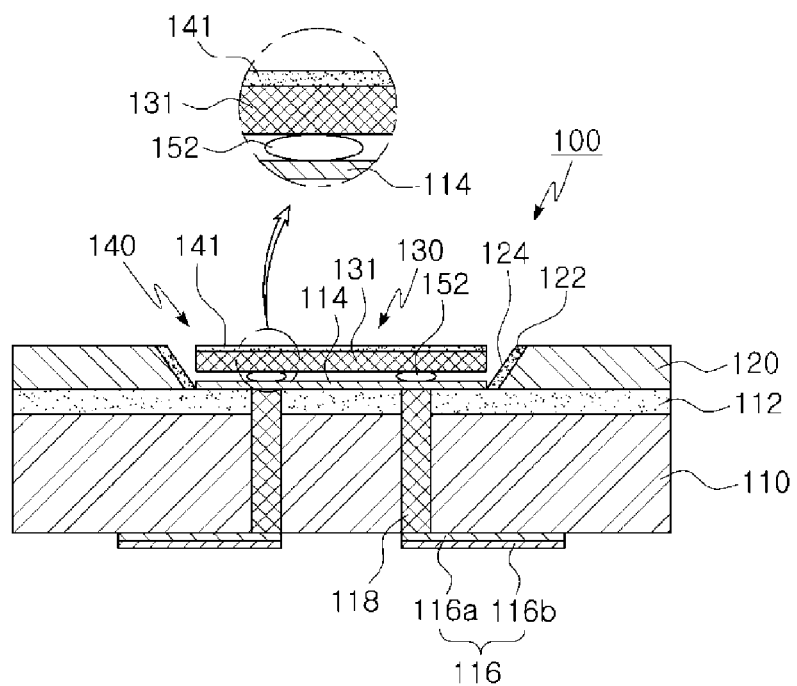
FIG. 11 is a cross-sectional view showing the wafer level LED package according to the first exemplary embodiment of the invention.

FIG. 11 is a cross-sectional view showing the wafer level LED package 100 according to the first exemplary embodiment of the invention. The wafer level LED package 100 includes the lower substrate 110, the upper substrate 120, and the light-emitting chip 130. The wafer lever LED package 100 according to the first exemplary embodiment may be formed substantially similarly to the method described above, and may include the same features.

The lower substrate 110 is made of a substrate material selected from among SiC, Si, GaN, and AlN, and the insulating-reflecting layer 112 is on the lower substrate 110. The electrode pattern 114 is on the insulating-reflecting layer 112, which is electrically connected to the light-emitting chip 130.

Here, the insulating-reflecting layer 112 may be formed as a DBR, which forms an insulating layer in the upper surface thereof, which is bonded to the upper substrate 120, while increasing light extraction efficiency by refracting and reflecting light that is generated from the light-emitting chip 130.

The external terminals 116 are provided on the underside of the lower substrate 110, and the conductive vias 118 electrically connect the electrode pattern 114 to the external terminals 116.

Here, each of the external terminals 116 can include the electrode pad 116a, which is in contact with the lower end of the conductive via 118, and the eutectic electrode 116b, which is stacked on the outer surface of the electrode pad 116a.

The upper substrate 120 is formed as a wafer member, which is made of a substrate material that is the same as or different from that of the lower substrate 110. The upper substrate 120 is integrally bonded to the upper surface of the lower substrate 110 having the insulating-reflecting layer 112, the electrode pattern 114, the external terminals 116, and the conductive vias 118.

Here, the cavity-forming opening 124 is perforated in an area of the upper substrate 120 corresponding to the electrode pattern 114, on which the light-emitting chip 130 is mounted, and a portion of the upper surface of the upper substrate 120 is removed using polishing, wet etching, or dry etching, so that the upper surface becomes substantially at the same level as the upper surface of the light-emitting structure 131, from which the chip substrate 132 is removed.

The cavity-forming opening 124 is in the form of a slope that is inclined at a predetermined angle, and the reflecting layer 122 is formed over the slope in order to increase light extraction efficiency by reflecting light having any wavelength bands, which is generated when the light-emitting chip mounted on the lower substrate operates. The reflecting layer 122 can be made of a reflective material that is the same as or different from that of the insulating-reflecting layer 112, which is formed over the upper surface of the lower substrate 110.

The light-emitting chip 130 includes the light-emitting structure 131, which is mounted on the electrode pattern 114 by flip-chip bonding. Here, the electrode pattern 114 is formed on the upper surface of the lower substrate 110, and the chip substrate 132 is removed from light-emitting structure 131 using laser beams L as described above. The light emitting structure 131 may be connected to the electrode pattern 114 using various methods. For example, bumps 152 may be used to electrically connect the light-emitting chip 130 to the electrode pattern 114.

The wavelength-converting structure 140 may convert light having a specific wavelength, which is generated in the light-emitting structure 131, into white light. As shown in FIG. 11, the wavelength-converting structure 140 can be formed as the fluorescent layer 141 that contains a fluorescent material, and is formed, by coating, over the upper surface of the light-emitting structure 131, which is exposed to the outside.

Figure 12:
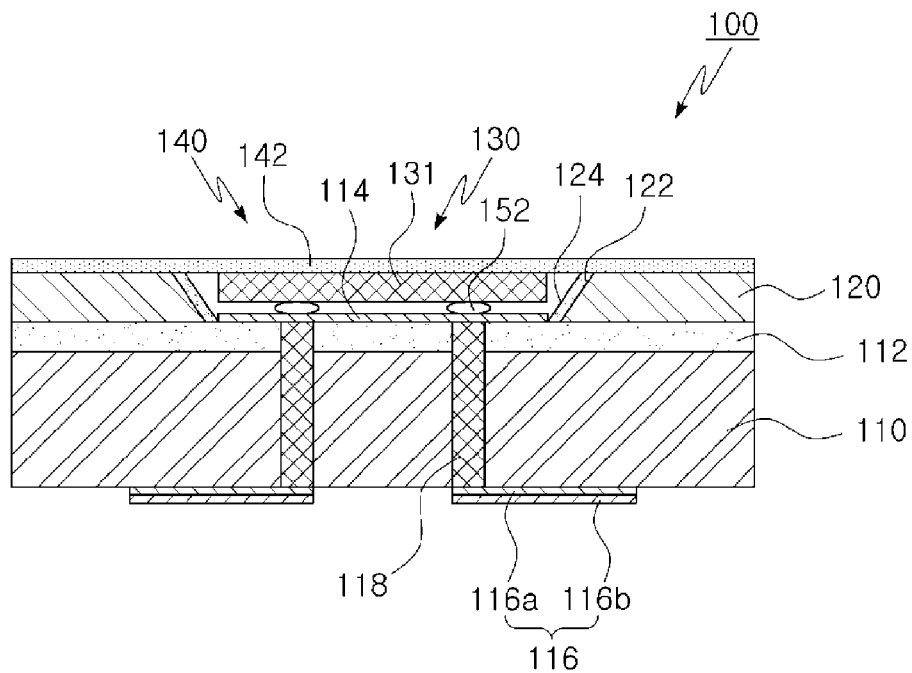
FIG. 12 is a cross-sectional view showing the wafer level LED package according to the second exemplary embodiment of the invention.
Figure 13:
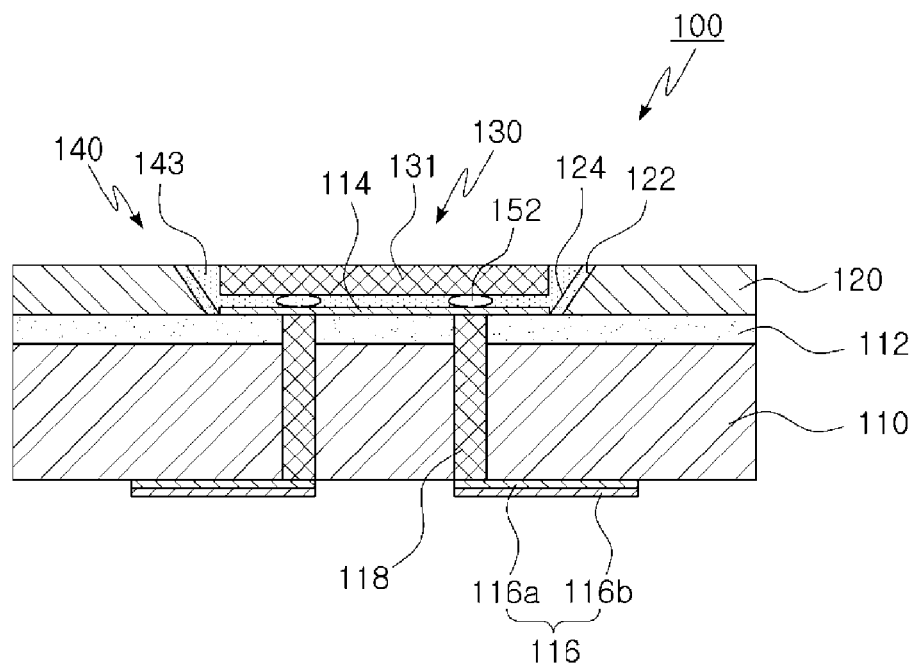
FIG. 13 is a cross-sectional view showing the wafer level LED package according to the third exemplary embodiment of the invention.

As shown in FIG. 12, the wavelength-converting structure 140 may be provided as the fluorescent film 142 containing a fluorescent material, the fluorescent film 142 being applied over the upper surface of the upper substrate 120 and the light-emitting structure 131. An air gap may be formed in the cavity-forming openings 124, between the fluorescent film 142, the light-emitting structure 131, and the upper surface of the upper substrate 120. Alternatively, as shown in FIG. 13, the wavelength-converting structure 140 may be provided as the resin fluorescent material 143 containing a fluorescent material, the resin fluorescent material 143 being dispensed into the cavity-forming openings 124. The upper surface of the upper substrate 120, the upper surface of the resin fluorescent material 143, and the upper surface of the light-emitting structure 131 are coplanar.

According to the exemplary embodiments described above, light generated in the light-emitting structure 131 may be emitted to the outside without passing through a chip substrate, thereby increasing light extraction efficiency and improving the optical characteristics of the package. In addition, exemplary embodiments of the present invention may prevent moisture from penetrating through a bonding surface and prevent thermal deformation from occurring, thereby increasing the reliability of a package product.

In addition, the insulating-reflecting layer 112, which is formed at the interface between the upper substrate 120 and the lower substrate 110, and the reflecting layer 122, which is formed over the slope of the opening 124, may increase the efficiency with which light is reflected outward when the light-emitting chip 130 operates, thereby further improving the optical characteristics of the package.

While the present invention has been shown and described with reference to the certain exemplary embodiments thereof, it will be apparent to those skilled in the art that various changes in form and details may be made therein without departing from the spirit and scope of the present invention and such changes fall within the scope of the appended claims.

The invention claimed is:

1. A wafer level light emitting diode package, comprising:
   a first substrate comprising:
      an insulating-reflecting layer and an electrode pattern arranged on a surface of the first substrate; and
      a conductive via;
   a terminal on which the first substrate is arranged;
   a second substrate arranged on the first substrate, the second substrate comprising a cavity-forming opening, the cavity-forming opening exposing the electrode pattern; and
   a light-emitting chip arranged on the electrode pattern,
   wherein the light-emitting chip is a flip-chip bonded light-emitting structure without a chip substrate,
   wherein the conductive via electrically connects the electrode pattern and the terminal, and
   wherein the second substrate and the light-emitting chip are substantially coplanar along a top horizontal surface of the wafer level light emitting diode package.

2. The wafer level light emitting diode package of claim 1, further comprising a wavelength-converting structure, wherein the wavelength-converting structure comprises a fluorescent layer disposed on a surface of the light-emitting structure, a fluorescent film disposed on a surface of the second substrate and the surface of the light-emitting structure, or a resin fluorescent material arranged in the cavity-forming opening.

3. The wafer level light emitting diode package of claim 1, wherein the terminal comprises an electrode pad, the electrode pad contacts a first end of the conductive via, and a eutectic electrode arranged on the electrode pad.

4. The wafer level light emitting diode package of claim 1, wherein each of the second substrate and the first substrate comprises SiC, Si, GaN, or AlN.

5. The wafer level light emitting diode package of claim 1, wherein a sidewall of the cavity-forming opening comprises a reflective layer.

6. The wafer level light emitting diode package of claim 5, wherein the insulating-reflecting layer and the reflective layer comprise the same reflective material.

7. The wafer level light emitting diode package of claim 5, wherein the insulating-reflecting layer and the reflective layer comprise different reflective materials.

8. The wafer level light emitting diode package of claim 1, wherein the insulating-reflecting layer comprises a distributed Bragg reflector (DBR).

9. The wafer level light emitting diode package of claim 2, wherein the fluorescent film is disposed on the top horizontal surface of the wafer level light emitting diode package.

10. The wafer level light emitting diode package of claim 3, wherein the electrode pattern contacts a second end of the conductive via.

11. A light emitting diode package, comprising:
   a first substrate;
   a reflective insulating layer disposed on a first side of the first substrate;
   an electrode disposed on the reflective insulating layer;
   a terminal disposed on a second side of the first substrate, the first side and the second side of the first substrate being opposite sides of the first substrate;
   a conductive via electrically connecting the electrode and the terminal;
   a second substrate arranged on the first side of the first substrate, the second substrate comprising an opening exposing the electrode; and
   a light-emitting chip arranged on the electrode,
   wherein the light-emitting chip is a flip-chip bonded light-emitting structure without a chip substrate, and
   wherein the second substrate and the light-emitting chip are substantially coplanar along a top horizontal surface of the light emitting diode package.

* * * * *